(12) United States Patent
Huang et al.

(10) Patent No.: US 10,354,830 B2
(45) Date of Patent: Jul. 16, 2019

(54) CHARGED PARTICLE BEAM SYSTEM

(71) Applicant: Carl Zeiss Microscopy, LLC, Thornwood, NY (US)

(72) Inventors: Weijie Huang, North Reading, MA (US); John A. Notte, Gloucester, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 292 days.

(21) Appl. No.: 15/469,702

(22) Filed: Mar. 27, 2017

(65) Prior Publication Data

US 2017/0294285 A1  Oct. 12, 2017

Related U.S. Application Data

(60) Provisional application No. 62/318,975, filed on Apr. 6, 2016.

(51) Int. Cl.
| | |
|---|---|
| *H01J 27/20* | (2006.01) |
| *B03C 3/38* | (2006.01) |
| *G21K 1/08* | (2006.01) |
| *G21K 1/087* | (2006.01) |
| *H01J 27/02* | (2006.01) |

(52) U.S. Cl.
CPC .............. *H01J 27/20* (2013.01); *B03C 3/383* (2013.01); *G21K 1/087* (2013.01); *H01J 27/022* (2013.01)

(58) Field of Classification Search
CPC ......... H01J 27/20; H01J 27/022; B03C 3/383; G21K 1/087
See application file for complete search history.

(56) References Cited

U.S. PATENT DOCUMENTS

| | | | | |
|---|---|---|---|---|
| 8,263,943 B2 * | 9/2012 | Shichi | ............... | H01J 27/26 250/311 |
| 2005/0045821 A1 * | 3/2005 | Noji | ............... | G01N 23/225 250/311 |
| 2009/0173888 A1 * | 7/2009 | Shichi | ............... | H01J 27/26 250/397 |
| 2011/0147609 A1 * | 6/2011 | Shichi | ............... | H01J 27/26 250/400 |
| 2012/0119086 A1 | 5/2012 | Shichi et al. | | |
| 2012/0132802 A1 | 5/2012 | Arai et al. | | |
| 2012/0199758 A1 | 8/2012 | Kawanami et al. | | |
| 2013/0126731 A1 * | 5/2013 | Shichi | ............... | H01J 37/08 250/310 |
| 2013/0264496 A1 * | 10/2013 | Arai | ............... | H01J 37/06 250/489 |

(Continued)

FOREIGN PATENT DOCUMENTS

| | | |
|---|---|---|
| EP | 2068343 A1 | 6/2009 |
| EP | 2088613 A1 | 8/2009 |

(Continued)

*Primary Examiner* — Nicole M Ippolito

*Assistant Examiner* — Sean M Luck

(74) *Attorney, Agent, or Firm* — Fish & Richardson P.C.

(57) ABSTRACT

An ion source includes an external housing, an electrically conductive tip, a gas supply system, configured to supply an operating gas into the neighborhood of the tip, and a cooling system configured to cool the tip. The gas supply system includes a first tube with a hollow interior, and a chemical getter material is provided in the hollow interior of the tube.

10 Claims, 6 Drawing Sheets

(56) References Cited

U.S. PATENT DOCUMENTS

| | | |
|---|---|---|
| 2015/0008332 A1 | 1/2015 | Notte et al. |
| 2015/0008333 A1 | 1/2015 | Notte et al. |
| 2015/0008334 A1 | 1/2015 | Notte et al. |
| 2015/0008341 A1 | 1/2015 | Notte et al. |
| 2015/0008342 A1 | 1/2015 | Notte et al. |

FOREIGN PATENT DOCUMENTS

| | | |
|---|---|---|
| EP | 2110843 A1 | 10/2009 |
| EP | 2182542 A1 | 5/2010 |
| WO | WO 2007/067310 A2 | 6/2007 |
| WO | WO 2008/152132 A2 | 12/2008 |

* cited by examiner

CHARGED PARTICLE BEAM SYSTEM

CROSS-REFERENCE TO RELATED APPLICATION

This application claims priority under 35 U.S.C. § 119(e)(1) to U.S. Provisional Application No. 62/318,975, filed Apr. 6, 2016. The contents of this application is hereby incorporated by reference in its entirety.

FIELD

This disclosure relates to a charged particle beam system, and more specifically to an ion source, especially for a charged particle beam system, a charged particle beam system comprising a respective ion source and, even more particular, to a gas field ions source for a charged particle beam system.

BACKGROUND

Charged particle source, charged particle systems and methods of operating charged particle systems and sources can be used for various applications including measuring or identifying sample properties or for sample modification. A charged particle source typically produces a beam of charged particles that can be directed by components of a charged particle beam system to be incident on a sample. By detecting interaction products of the charged particle beam with the sample images of a sample can be generated or properties of the sample can be identified.

The following documents include prior art which can be of some relevance for the present disclosure: EP2088613A1, EP2182542A1, US2012119086, EP2068343A1, EP2110843A1, US2012132802, US2012199758, WO 2007067310, WO08152132A2, US 20150008341A1, US 20150008333A1, US 20150008342A1, US 20150008334A1 and US 20150008332A1.

SUMMARY

According to a first aspect the disclosure relates to an ion source comprising an external housing, an electrically conductive tip and a gas supply system. The gas supply system can be configured to supply an operating gas into the neighborhood of the tip. The gas supply system includes a first tube with a hollow interior. A chemical getter material is provided in the hollow interior of the tube. The ion source further includes a cooling system configured to cool the tip.

According to a further aspect of the disclosure the getter material is provided as a coating to at least a portion of an inner surface of the first tube.

According to another aspect of the disclosure the cooling system is configured to cool the first tube.

According to another aspect of the disclosure the first tube includes a material with a high thermal conductivity.

According to a further aspect of the disclosure the gas supply system further comprises a second tube which includes a material of low thermal conductivity. Especially the thermal conductivity of the first tube can be a factor of three or more larger than the thermal conductivity of the second tube. Even more preferable, the thermal conductivity of the first tube can be an order of magnitude or more larger than the thermal conductivity of the second tube.

According to a further aspect of the disclosure the first tube is attached to the second tube and the second tube is connected to the external housing.

According to a further aspect of the disclosure the cooling system is connected to said first tube.

According to a further aspect of the disclosure the first tube is formed into a bellow shape.

According to a further aspect of the disclosure the chemical getter includes at least one material from the group of materials comprising titanium, iron, barium, aluminum, palladium, zirconium, vanadium, and alloys thereof. Some specific alloys that are commercially known include SAES St 101 (Zr.84-AL.16) and SAES St 707 (Zr.70-V.246-Fe.054.) The zirconium-based system is very reactive with a wide variety of gas molecules such as $H_2$, $CO$, $CO_2$, $O_2$, $N_2$, and $NO_x$ to form essentially nonreactive oxides, carbides, and nitrides.

According to a further aspect of the disclosure the ion source further includes a heater within the external housing.

According to a further aspect of the disclosure the ion source further includes an internal housing arranged within the external housing, wherein the electrically conductive tip is mounted within the internal housing.

According to a further aspect of the disclosure the first tube has a terminating portion terminating in or at the inner housing.

According to a further aspect of the disclosure the cooling system is connected to a base portion of the inner housing.

According to a further aspect of the disclosure the ion source further includes a gas purification system. The gas purification system can be configured to purify the gas by selective ionization of contaminants. For such purpose the gas purification system can include an electrode and a voltage supply providing an electrical potential to the electrode.

According to another general aspect the disclosure relates to a gas purification system comprising a housing, a gas inlet opening within the housing, a gas outlet opening within the housing, an electrode, and a voltage supply configured to supply an electrical potential to said electrode.

The gas purification system can include a second electrode to which a negative potential or ground potential is applied. In addition the second electrode can include a chemical getter material.

BRIEF DESCRIPTION OF THE DRAWINGS

Details of embodiments will hereinafter be described with reference to the attached drawings, in which.

DETAILED DESCRIPTION

Figure 1:
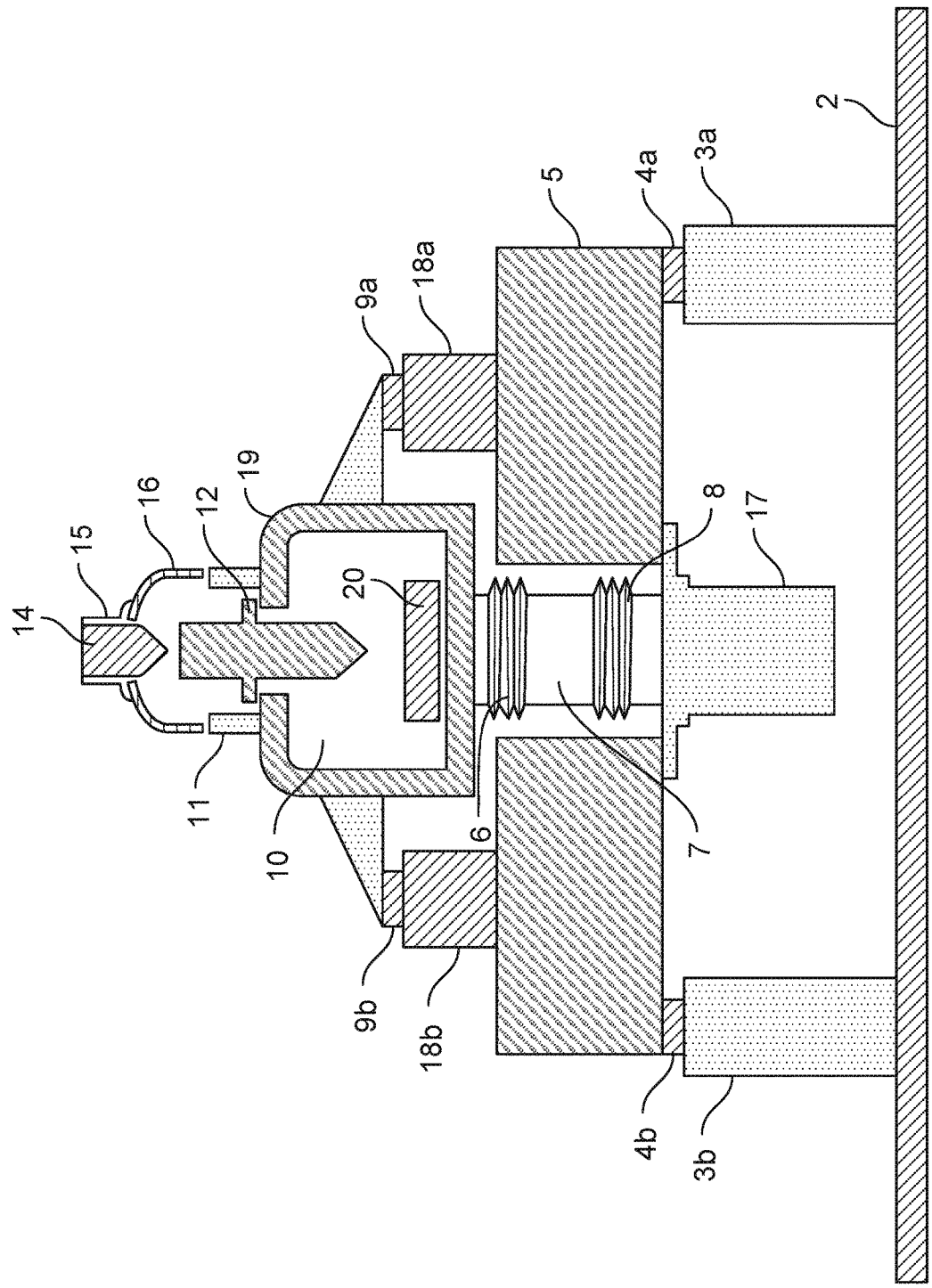
FIG. 1 shows the mechanical set-up of a charged particle beam system in a sectional view.

The charged particle beam system in FIG. 1 comprises a sample chamber 10 which is positioned and mounted on a heavy and massive table 5. The table 5 can be a granite plate or a plate made of concrete. The table 5 itself rests on a number of first legs 3a and 3b of which two are shown in FIG. 1. The first legs 3a, 3b are designed to become positioned on a floor 2. Each of the first legs 3a, 3b comprise or support a first vibration isolation member 4a, 4b to avoid the transmission of vibrations from the floor to the table 5.

The sample chamber 10 rests on the table 5 via a number of second legs 18a, 18b also each comprising or supporting a second vibration isolation member 9a, 9b. These second vibration isolation members 9a, 9b serve to reduce or avoid the transmission of vibrations from the table 5 to the sample chamber. Such vibrations of the table 5 can originate from a mechanical vacuum pump 17, for example a turbo pump, which is firmly attached to or mounted on the table 5. Due to the large mass of the table 5 the vibration amplitudes generated by the mechanical pump 17 are greatly reduced.

The mechanical pump 17 is functionally connected to the sample chamber 10. For this functional connection a suction port of pump 17 is connected via two flexible bellow portions 6, 8 with a stiff tube 7 or a compact vacuum flange between both flexible bellow portions to the sample chamber 10. The complete line from the pump 17 to the sample chamber forms a series arrangement of "flexible bellow portion—stiff tube—flexible bellow portion". This arrangement serves to further attenuate the vibrational energy, and reduces the vibrations transmitted from the table to the chamber. The vibrations of the chamber can be reduced further when the mass of the intermediate tube is large. The vibrations of the chamber can be further reduced if there is an energy absorbing material in contact with the bellows or the tube. The chamber vibrations can be further reduced if there is a mechanical resonance of the tube and bellows that preferentially absorbs and dissipates the vibrational energy at the frequencies caused by the pump (17).

The sample chamber 10 has a vacuum tight housing 19. A tubular extension 11 is firmly and non-detachable mounted to the housing 19 of the sample chamber 10. The tubular extension 11 can be formed by a metal tube welded to the remaining portions of the housing 19 surrounding the sample chamber 10. Alternatively, the tubular extension can be an integral part of the chamber housing itself.

Within the tubular extension 11 a charged particle column 12 is mounted. The charged particle column 12 thereby comprises lenses, diaphragms and beam scanning systems not shown in FIG. 1. By directly mounting the components of the charged particle column 12 within a tubular extension of the housing 19 of the sample chamber 10 mechanical vibrations between the components of the charged particle column and a sample stage 20 arranged within the sample chamber 10 can be avoided or at least reduced.

On the tubular extension 11 of the housing 19 of the sample chamber a module comprising the charged particle source is attached. This module comprises a lower housing portion 16 having an upper spherical surface which forms one portion of a two axes tilt mount. In addition this source module comprises an upper housing 15 in which the charged particle emitter is mounted. In the shown case the charged particle source is a gas field ion source and the charged particle emitter 14 is an electrically conductive tip. The upper housing 15 also has a spherical surface portion forming a second part of the two axis tilt mount. By the aid of this tilt mount the upper housing portion 15 holding the charged particle emitter 14 can be tilted about two axes relative to the charged particle column 12 to align the axis of emission of charged particles emitted by the charged particle emitter 14 to an optical axis defined by the charged particle components arranged within the charged particle column 12.

Figure 2:
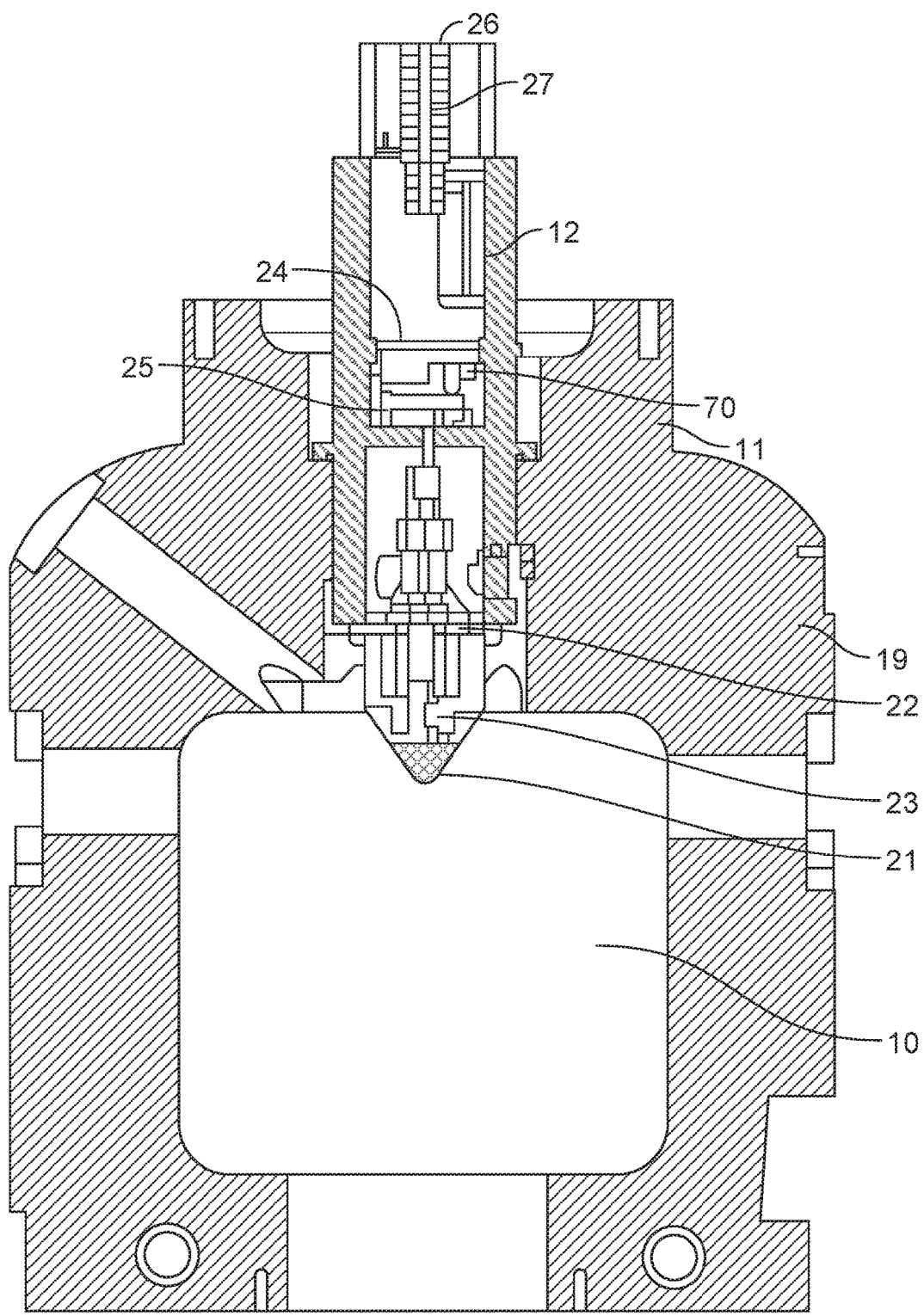
FIG. 2 shows an enlarged sectional view of the particle chamber of the charged particle beam system in FIG. 1.

In FIG. 2 the housing 19 of the sample chamber 10 with the tubular extension is shown in more details. The charged particle column 12 mounted in the tubular portion 11 comprises several diaphragms 22, a deflection system 23 and an objective lens 21 with which a charged particle beam can be focused onto a sample and scanned across a sample which can be positioned on a sample stage (not shown here) in the sample chamber 10. In the case that the charged particle beam system is a gas field ion beam system the lens 21 and the deflection system 22 are electrostatic components which act on the ions by electrostatic forces due to different electrostatic potentials applied to components of the systems. In addition the charged particle column 12 comprises a first pressure limiting aperture 24 and a second pressure limiting aperture 25 which form an intermediate vacuum region (mid column region 70) between the vacuum region in which the emitter tip 14 is positioned and the sample chamber 10. The component of the charged particle column 12 closest to the emitter of the gas field ion source is an electrode 26 forming a part of a condenser lens followed by a deflector 27 for aligning the beam coming from the gas field ion source to the optical axis defined by the charged particle optical components following downward in the direction of beam propagation to the sample chamber 10.

It should be noted that the charged particle beam system not necessarily is configured as a gas field ion beam system. Also other charged particle beam systems are possible using a different kind of a charged particles source, for example a so called liquid metal ion source or an electron source, especially a field emission electron source.

Figure 3:
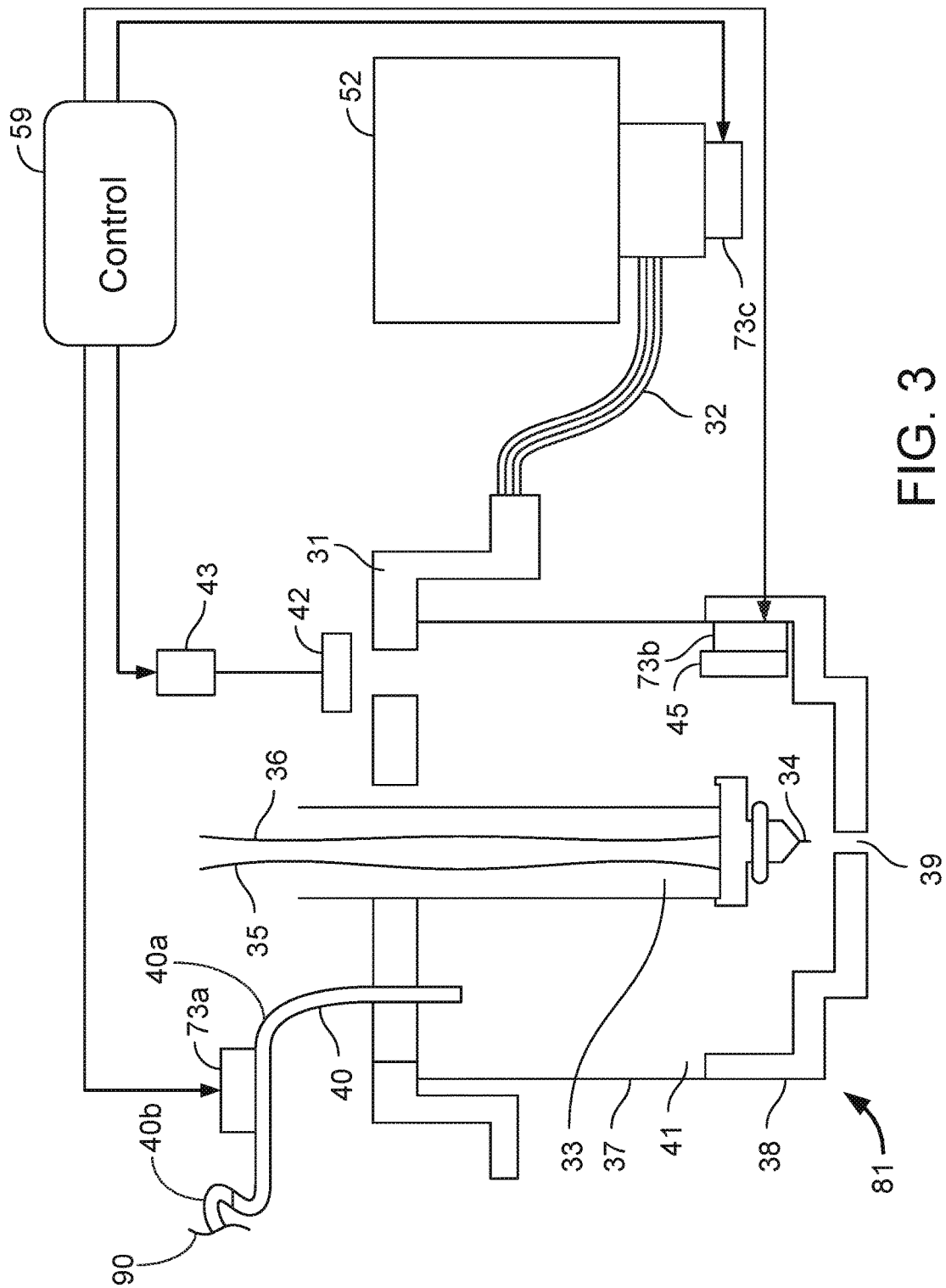
FIG. 3 shows an enlarge sectional view of a gas field ion source.

In FIG. 3 the design of a compact ion source in the form of a gas field ion source is shown. This gas field ion source is designed with double nested insulators. This is a compact design while still providing high voltage, variable beam energy, and gas containment. The design consists of several parts. The first part is a thermally conductive (e.g. copper) base platform 31 which is grounded and is directly linked and thermally connected to a cryogenic cooling system by way of a flexible thermal conductor 32, for example copper ribbons or copper braids. The flexibility of the thermal conductor 32 allows the complete gas field ions source to tilt, and to minimize any vibration transport. The thermal conductivity of the braids allows them to also heat the gas field ion source as a periodic maintenance procedure.

The cryogenic cooling system can be a dewar filled with liquid and/or solid nitrogen. Alternatively, the cryogenic cooling system can be a dewar filled with solid nitrogen. The dewar can comprise a heater 73c with which the dewar as well as the base platform 31 can be heated. Alternatively, the cryogenic cooling system can be a mechanical refrigerator.

Attached to this grounded base platform 31 is a central tubular high voltage insulator 33, for example made of alumina or sapphire, that mechanically supports the electrical conductive tip 34 which forms the gas field ion emitter. The central tubular insulator 33 provides over 30 kV of electrical isolation with respect to the base platform 31. This central insulator 33 has one or more openings for connection of high voltage leads 35, 36 connected to the conductive tip 34 for providing the high voltage for operating the tip 34 as a gas field ion source and also to supply a heating current for heating the tip 34.

Also attached to the base platform 31 is an outer tubular and cylindrical insulator 37 that surrounds the central insulator 33. The outer tubular insulator 37 mechanically supports an extractor electrode 38 and provides also more than (over) 30 kV of electrical insulation. The extractor electrode 38 is designed with a small hole 39 (e.g. 1 mm, 3 mm, 5 mm diameter) that by design is a small distance (e.g. 1 mm, 3 mm, 5 mm) from the apex of the tip 34. Together the base platform 31, the central insulator 33, the outer cylindrical insulator 37 and the extractor electrode 38 define an inner gas confining vessel 41. The vacuum conduction or pumping speed through the hole 39 of the extractor electrode can be relatively small to support a relative high pressure in the region of the electrically conductive tip 34 compared to the region outside the inner gas confining vessel 41. The only passages for gas to escape are the aforementioned extractor hole, and a gas delivery path 40, and a pumping valve 42. The gas delivery path is through a small tube 40 that passes from a supply bottle to the interior gas confining vessel 41 through the grounded base platform 31. The pumping valve 42 can be mounted on the base platform 31, or integrated into the gas delivery path 40.

All of the above mentioned components of the charged particle source are supported on the base platform 31 that is mechanically supported by a stiff yet thermally non-conductive support structure (not shown) that mounts to the upper portion of the exterior vacuum vessel (15 in FIG. 1). The upper portion of the exterior vacuum vessel is allowed to tilt to a small angle up to 5 degrees by the interface of a concave spherical surface with a corresponding convex spherical surface in the lower external vacuum housing (16 in FIG. 1).

Within the inner gas confining vessel an ion getter 45 is arranged. Improved vacuum in the inner gas confining vessel is attained with the inclusion of chemical getters 45 in the interior of the gas confining vessel 41. These chemical getters 45 are activated at the time of baking the gas field ion source. A heater 73b is provided to heat the chemical getters 45. During the heating of the chemical getters 45 to a temperature of about 200° C. for 2 hours and upon cooling these components the chemical getters 45 leave many chemically active materials, such as Zr, V, Fe and Ti, etc., that serve to effectively pump many spurious gas species. The getters can be coated directly onto the surfaces of existing parts, for example the outer cylindrical isolator 37, or they can be ribbon like materials that are attached to the interior surfaces forming the inner gas confining vessel. The pumping speed of the chemical getters for hydrogen is of importance since among the likely impurities, hydrogen is not effectively cryo-pumped by the surfaces cooled to cryogenic temperature. These chemical getters 45 in the inner gas confining vessel 41 are also very effective for further purification of the delivered helium and neon gases. Being noble gases, the helium and neon are not affected, but all impurities are effectively pumped. During their periodic regeneration, the evolved gases can be pumped away in an improved manner by opening the purpose-made bypass valve 42 (flapper valve) that connects the inner gas confining vessel 41 to the exterior gas containment 81.

The inner gas confining vessel 41 can be surrounded by a radiation shield which minimizes the radiative heat transfer from the exterior vessel walls (at room temperature) to the ion source. The inner gas confining vessel 41 also can contain an optically transparent window that allows a direct line of sight onto the tip 34 of the emitter from outside the inner vacuum vessel. An aligned window in the exterior vacuum vessel allows a camera or pyrometer to observe the emitter tip of the gas field ion source. Such a camera can inspect the source, or monitor its temperature during the periodic maintenance. One or both of these windows can include leaded glass to minimize radiation transfer of X-rays from the interior to the exterior. The base platform 31 due to its high thermal conductivity is also well suited for a temperature sensor such as a thermocouple.

The gas supply tube 40 comprises a first tube 40a and a second tube 40b. In addition the gas supply tube can comprise a heater 73a. The first tube 40a is made of a material of high thermal conductivity, for example oxygen-free copper. The first tube 40a is connected to the base platform 31 and accordingly is cooled by the cooling system 52 via thermal conductor 32 (flexible copper braids) and base platform 31. Within the inner hollow volume of the first tube 40a a chemically active getter material, such as Ti, Ni, Pd, or a non-evaporable getter such as Ti—Fe—V is provided. The getter material especially can be provided in the form of a coating onto the inner surface of the first tube 40a. Alternatively the chemical getter can be provided as ribbon-like materials that are attached to the interior surface of the first tube 40a.

The second tube 40b consists of a material with relatively low thermal conductivity, for example stainless steel, with a small wall thickness of the tube. By configuring the second tube 40b with a sufficient small wall thickness the thermal conductivity of the second tube can be at least a factor of ⅓ smaller than the thermal conductivity of the first tube 40a. Via this second tube 40b the first tube 40a is connected to the wall of the outer housing 90 which is at environmental temperature. Because of the low thermal conductivity of the second tube 40b during operation of the ion source only a relatively small amount of heat is conducted from the environment to the first tube 40a with the result that the first tube 40a is efficiently cooled by the cooling system 52 and therefore kept at a low cryogenic temperature. Due to the cryogenic temperature of the first tube 40a its inner wall surface acts as a cryo-pumping surface. Undesirable gas species having a boiling point at a temperature above the temperature of the first tube, such as water vapor, CO, $N_2$, become condensed in the neighborhood of the inner tube surface and kept there, and are not likely to desorb at these temperatures due to their chemical and physical binding, whereas noble gases which are used as operating gas in the ion source are not cryo pumped. In this way the gas conducted through the first and the second tubes into the inner gas confinement vessel 41 are further purified.

For example, the thermal conductivity of second tube 40b contacting the environmental temperature can be less than 45 Watts per meter Kelvin. For example the second tube 40b can comprise carbon steel, stainless steel or Teflon. Carbon Steel is a relatively good thermal insulator with a thermal conductivity of 43 Watts per meter Kelvin. Stainless steel is an even better thermal insulator with a thermal conductivity of 15 Watts per meter Kelvin. Teflon is another thermal insulators with a thermal conductivity of just 2 Watts per meter Kelvin. As an example, the second tube 40b can be a hollow stainless steel tube having a 2.0 mm inner diameter and a 2.2 mm outer diameter, and a length of 4 cm. The low thermal conductivity of this tube will cause a temperature drop of 202° C. if there are 50 mW of heat passing through it (since heat passes from the warmer end of the tube to its cooler end). To improve the insulating properties and to further reduce the thermal conductivity of the second tube 40b, the second tube can be made of a thinner wall (e.g. smaller than 0.1 mm thickness) or for a longer length (larger than 4 cm).

For the first tube 40a connected to the base platform 31 (i.e. the coldest part) of the ion gun, a material is chosen with a relatively high thermal conductivity. The first tube 40a can comprise aluminium or OFHC copper providing a thermal conductivity of 150 Watts per meter Kelvin or more, or even 400 Watts per meter Kelvin if made of OFHC copper. As an example, a hollow tube of OFHC copper having a 2.0 mm inner diameter and a 2.2 mm outer diameter and having a length of 6 cm for the first tube 40a will cause a temperature drop of 11° C. if there are 50 mW of heat passing through it. To improve the isothermal properties of this portion of the first tube 40a the wall thickness can be made thicker (e.g. larger than 0.1 mm) or the length can be made be made shorter (e.g. less than 3 cm).

Combining the previous two examples of the different tubes 40a, 40b of different materials, it is clear that the combined tubes in series with 50 mW of power transmitted will produce a total temperature difference of about 213° C. This is the desired temperature difference between the base platform (near 80 Kelvin) to the exterior vessel at atmospheric conditions of about 20° C. (about 293 Kelvin). The above example materials are desirable since the first tube 40a will be relatively cold. The temperature difference between one end and another end thereof will be from 80 Kelvin to about 91 Kelvin. This makes the inner surface of the first tube 40a very effective for cryo-trapping and cryo-pumping. In contrast thereto the second tube 40b has a much larger temperature drop from 91 Kelvin to 293 Kelvin (20° C.). This serves to minimize the overall heat transport from the warm ambient or environmental temperatures to the internal cryogenic temperatures. Other design variations could include different lengths, different wall thickness, different materials, or convoluted shapes.

With other words, the materials and geometric parameters of the first tube 40a and the second tube 40b are configured, either by selecting different materials for the first and the second tube, and/or by selecting different thicknesses of the tube walls and/or tube lengths, in a manner that 70% or more, more preferably 90% or more, of the complete temperature drop between the outer housing 90 being at environmental temperature and the coolest portion of the first tube 40a appears along the second tube 40b of relatively low thermal conductivity; due to this configuration of the first and second tube in a complementary manner less than 30%, more preferably less than 10% of the complete temperature drop between the outer housing 90 being at environmental temperature and the coolest portion of the first tube 40a appears along portions of the first tube 40a so that the complete first tube 40a is, when the gas field ion source is operated, at a cryogenic temperature.

The gas field ion source is operated at a voltage that is established based upon the geometrical shape of the emitter tip 34. The geometrical shape includes factors such as the average cone angle, and the average radius of curvature of the emitter tip 34.

The above mentioned design has the advantage of a small mass, and a small volume. These both allow for faster thermal cycling and reduced cooling load, and reduced cost, and reduced complexity. In addition, the compact design allows a quick change of the noble gas with which the gas field ion source is operated. Especially the compact design of the inner gas confining vessel 41 allows a quick change between operating the gas field ion source with helium and operating the gas field ion source with neon.

Under ideal operation conditions, the apex of the emitter tip 34 is roughly spherical (e.g. with a diameter of 50, 100, or 200 nm.) The spherical surface is in fact better described as a series of planar facets that approximate a sphere. Near the apex of the tip 34 of the emitter, the end form is better approximated by three planar facets that intersect at a single vertex forming a three sided pyramid. The pyramid edges can be relatively shallow angled (e.g. 70 or 80 degrees with respect to the axis of the emitter). The ridges and the apex of the pyramid are somewhat rounded at the atomic level so that there are no single atom ridges or that there is not a single atom at the apex.

Under ideal operation conditions there are three atoms of the emitter material at the apex which form an equilateral triangle. These three atoms, hereinafter called the "trimer", protrude the most, and hence produce the largest electric field when a positive voltage (e.g. 20 kV, 30 kV, 40 kV) relative to the extractor electrode is applied to the tip. In the presence of helium or neon gas, the neutral atoms can be field ionized just above these three atoms. At relatively high gas pressures (at local pressures of $10^{-2}$ Torr, or $10^{-3}$ Torr) the ionizations can happen at rates of $10^6$ or $10^7$ or $10^8$ ions per second. Under the ideal circumstances, this steady stream of ions is constant over time and persists indefinitely.

To the extent that in this specification the unit Torr is used it can be substituted by mbar.

In reality, under typical conditions when operating with helium, the ion emission can represent 100 pA of emitted current, and it can persist for 10 or more continuous days, and show up and down fluctuations that are on the order of 0.5% over timescales of ms or faster. Gradual loss of emission current can progress at a rate of 10% per day if uncorrected. The helium performance (or the performance of operation with helium) is somewhat impacted by the purity of the gas which can be 99.9990%, or 99.9999% purity or even better and the quality of the base vacuum in absence of helium typically is $2\times10^{-9}$ Torr, $1\times10^{-9}$ Torr, $5\times10^{-10}$ Torr or even better.

Spurious atoms in the supplied neon gas (e.g. $H_2$, $N_2$, $O_2$, CO, $CO_2$, $H_2O$, etc.) can disturb the availability of neon to reach the tip of the gas field ion source, and hence can cause emission instability both on the short and on the long time scales. The spurious atoms can also facilitate the etching of the emitter material causing it to gradually change its shape over time which can reduce the ion emission current gradually and can reduce the optimal operating voltage gradually. The spurious atoms can also cause one or more of the atoms of the emitter tip 34 to be more readily field evaporated causing abrupt emission drops. Therefore the cryo-pumping effect of the inner wall surface of the first tube 40a of the gas supply system serves to stabilize the ion emission by the ion source and in addition serves to increase the lifetime of the tip 34.

Figure 5:
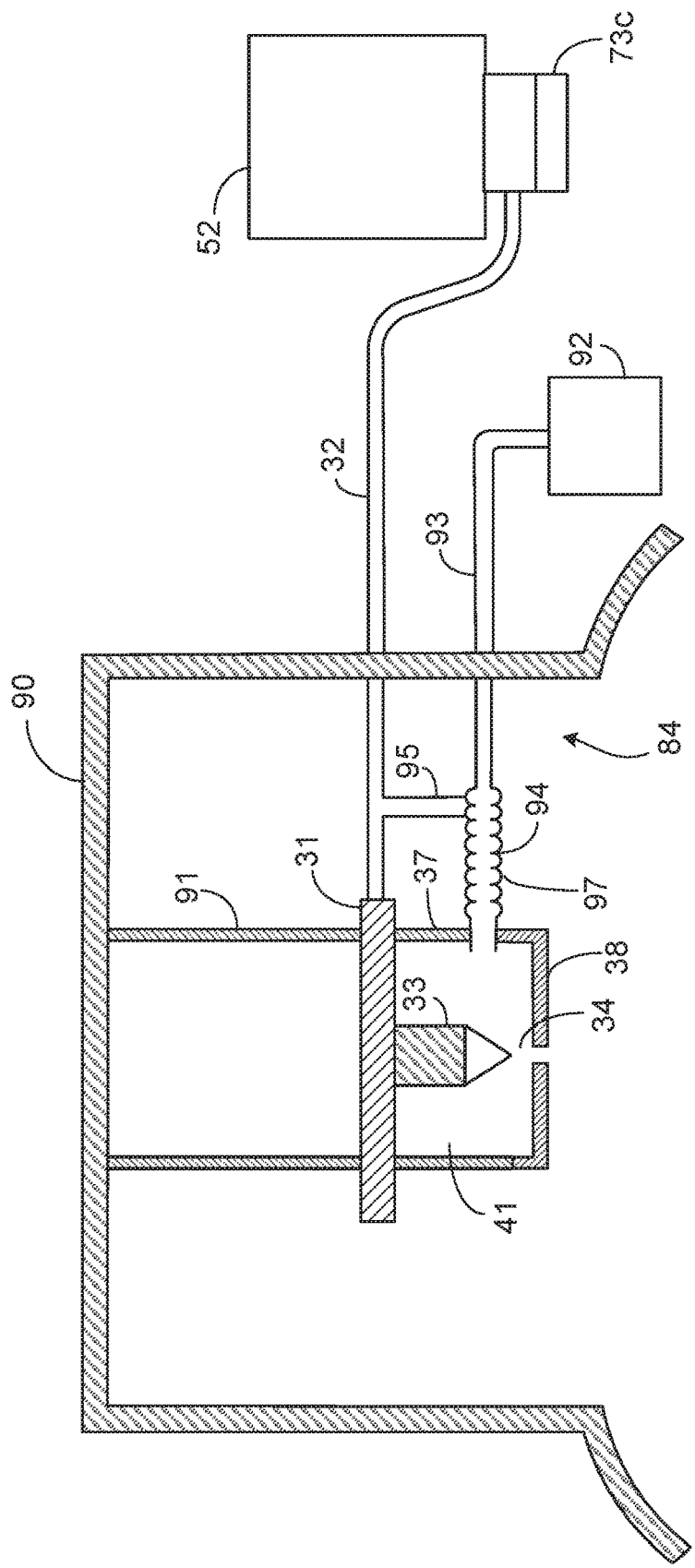
FIG. 5 shows an enlarged sectional view of another embodiment of a gas field ion source.

FIG. 5 shows an alternative embodiment of a gas field ion source. Components of the gas field ion source corresponding to components already described with respect to the embodiment in FIG. 3 have the same reference numerals as in FIG. 3.

Via a holding structure 91 the base platform 31 is mounted to the outer vacuum wall 90. The outer vacuum wall 90 is at environmental temperature, e.g. room temperature. Via a cylindrical insulator 37 the extractor electrode 38 is mounted to the base platform 31. The space enclosed by the base platform 31, the cylindrical insulator 37 and the extractor electrode 38 again forms the inner gas confining vessel 41. Within the inner gas confining vessel 41 the tip 34 of the gas field ion source is mounted via an inner cylindrical insulator 33 to the base platform 31.

The base platform 31 is cryogenically cooled by a cryogen provided in dewar 52. The heat is conducted from the base platform 31 via a cold finger in the form of a flexible thermal conductor 32, for example a copper braid, through the outer vacuum wall 90 to the dewar 52.

The gas supply system 92 provides the operating gases for the gas field ion source, e.g a noble gases such as helium, neon or argon. The gas supply system further comprises a second tube 93 leading through the outer vacuum wall 90 into the vacuum space 81. Again the second tube 93 is made of a material with low thermal conductivity such as stainless steel with thin tube walls. Within the vacuum space the gas supply system comprises a first tube 94 which is connected to the outer cylindrical insulator 37 and to the second tube. Via the first tube 94 the operating gas is supplied into the inner gas confining vessel 41. This first tube 94 is made of a material with high thermal conductivity, such as oxygen-free copper, and it has a bellow form to increase its internal surface. The internal surface of the first tube 94 is, at least partly, coated with a chemical getter 97 as described above.

For cooling the first tube 94 the first tube is connected via a first thermal conductor 95 and flexible thermal conductor 32 to dewar 52.

The function of purifying the gas introduced into the inner gas confining vessel 41 works in the same manner as with the embodiment described above. Undesirable gases such as water vapor, CO, $N_2$ are trapped or cryo-pumped by the internal surface of first tube 94 being, during operation of the ion source, at cryogenic temperature. During bake-out the first tube 94 becomes heated via heater 73c, flexible thermal conductor 32 and thermal conductor 95 and the trapped gases evaporate and can be pumped away. During bake-out the chemical getter also in part vaporizes or buries remaining contaminants.

Figure 4:
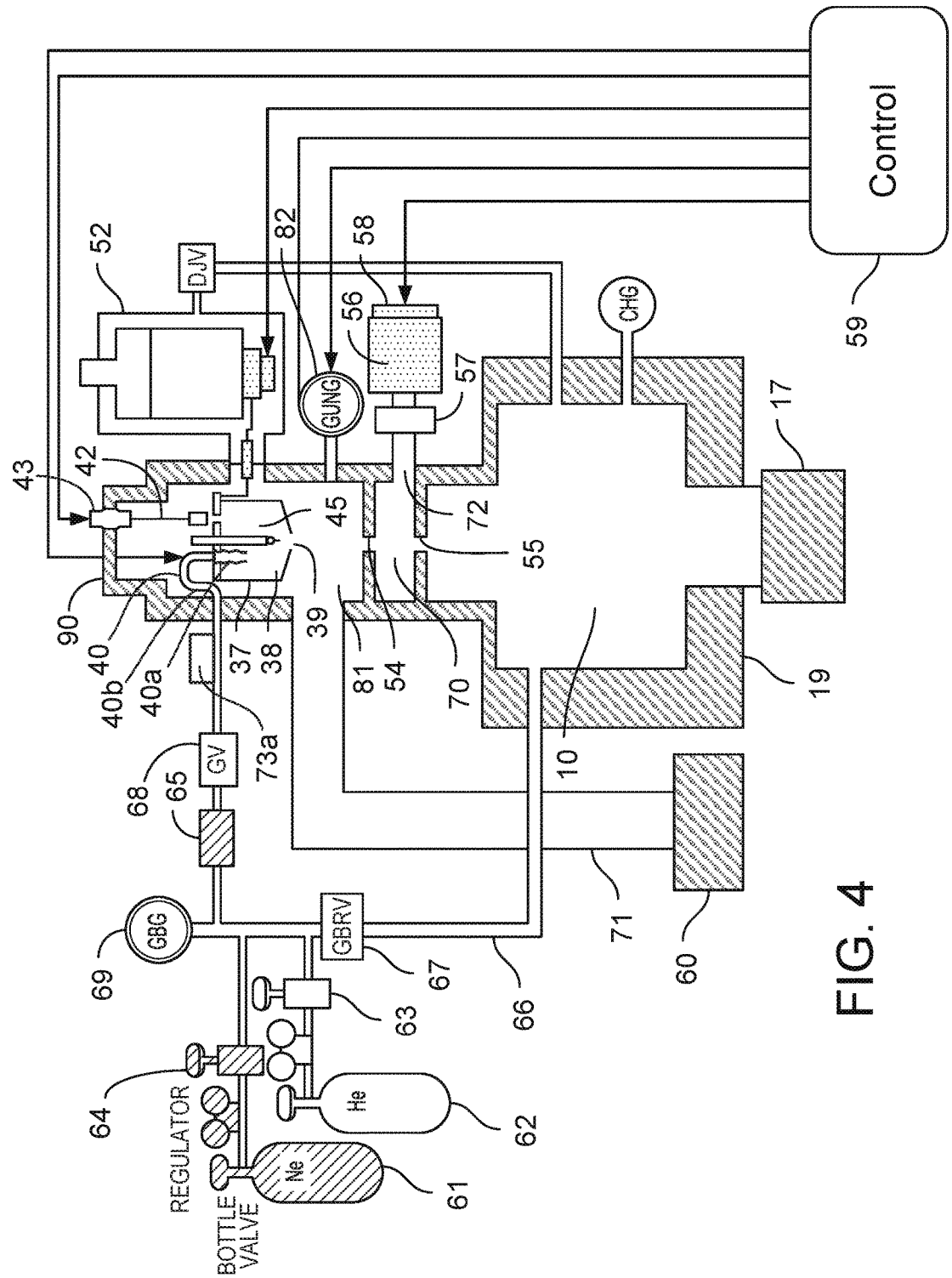
FIG. 4 shows a sketch of the charged particle beam system including a gas supply system.

FIG. 4 shows the principles of a gas field ion microscope that can be operated with two different noble gases for the ion beam, in this particular case either with helium or with neon. The gas field ion microscope has three vacuum regions, within the microscope's housing 19. The first vacuum region is the sample chamber 10, the second vacuum region is the mid column region 70 and the third vacuum region is the outer vacuum containment 81 in which the gas field ion source is housed. The mid column region 70 is positioned between the outer gas containment 81 and the sample chamber 10.

As described before, the sample chamber is evacuated by a turbo molecular pump 17 which is mounted on table 5 (not shown in FIG. 4). The outer gas containment 81 also is evacuated by a mechanical pump 60 which also can be a turbo molecular pump which also can be mounted on table 5. The connection between the mechanical pump 60 evacuating the outer gas containment 81 can be designed like the connection between pump 17 and the sample chamber, i.e. the connection between pump 60 and the outer gas containment 81 also can comprise two flexible bellows with a stiff tube or a compact vacuum flange between them. The mid column region 70 is separated from the outer gas containment 81 by a first pressure limiting aperture 54. In a similar manner the mid column region 70 is separated from the sample chamber 10 by a second pressure limiting aperture 55. The mid column region 70 is evacuated by a mid column pump 56, which can be an ion getter pump or a non-evaporable getter pump. This provides advantages since these kinds of pumps 56 do not generate any vibrations.

Mid column pump 56 is connected to and controlled by a control 59. Control 59 operates mid column pump 56 in a manner that mid column pump 56 can be switched-off at any time at which the gas field ion source is operated and/or noble gas is supplied to the inner gas confining vessel 41.

The mid column pump 56 evacuating the mid column region 70 is attached to the mid column region via a flange 72. In flange 72 a valve 57 is provided which can be closed if the mid column pump 56 needs to be exchanged or otherwise serviced or if the mid column pump is switched off or if the mid column pump should not evacuate the mid column region 70. In this manner, exchange or servicing of mid column pump 56 is possible without venting the mid column region 70.

Mid column pump 56 comprises a heater 58 which also is connected to and controlled by control 59. By the heater 58, the mid column pump 56 can be heated to release noble gas and other volatile adsorbates from the mid column pump 56 to clean it. The heating can also cause the pumped adsorbates to be more diffused from the surface and be more deeply buried, and thereafter leave the surface cleaner for further adsorption pumping mechanism.

The outer gas containment 81 comprises a pressure measuring device 82 which also is connected to control 59. The control 59 is configured, for example by a computer with a software program, that only switches mid column pump 56 on if the pressure within the outer gas containment 81 is below a predefined pressure value, i.e. when an output signal of pressure measuring device 82 indicates a pressure in the outer gas containment 81 below the predefined pressure value. In this manner the life time of mid column pump 56 can be extended.

As already described above in connection with FIG. 3, within the outer gas containment 81 the gas field ion source is arranged. In FIG. 4 only that components of the gas field ion source are shown which form the inner gas confining vessel 41, i.e the base platform 31, the outer tubular insulator 37, and the extractor electrode 38 with the extractor hole 39. Also shown in FIG. 4 is the getter 45 within the inner gas confining vessel 41.

Also shown in FIG. 4 is the flapper valve 42 with its drive 43 which also is connected to and controlled by control 59. Flapper valve 42 can be opened by its drive 43 if a quick evacuation of the inner gas confining vessel 41 is desired, for example if a change of operation of the gas field ion source between operation with helium to generate a helium ion beam and operation with neon to generated a neon ion beam is desired. In addition, when the ion source is out of operation in a manner that no ion beam is generated, the flapper valve can also be opened to provide improved vacuum of the inner gas confining vessel 41.

The gas field ion microscope comprises a cooling device, for example a dewar 52 with which the emitter tip as well as gas supply tube 40 and the base platform 31 are cooled. Not shown in FIG. 4 is the thermal connection between dewar 52 and the cooled components like the base platform 31 or the gas supply tube 40. The dewar 52 comprises a vacuum jacket to insulate the inner chamber of the dewar configured to be filled with a cryogen from the outer world. Via a dewar jacket valve and a vacuum line the dewar jacket is connected to the sample chamber 10. In this way the vacuum in the vacuum jacket can be maintained at the pressure of the sample chamber. The dewar jacket valve can be closed if any process gases are supplied to a sample positioned in the sample chamber, if the chamber is vented, or generally whenever the chamber pressure is above a predefined pressure value, of for example $10^{-6}$ torr. By closing the dewar jacket valve accumulation of condensible gases in the dewar jacket can be avoided.

The gas supply system of the gas field ion beam system shown in FIG. 4 comprises two gas bottles 61, 62, one comprising helium and one comprising neon. Both gas bottles have a pressure regulator to ensure a constant gas pressure in the gas supply line after the pressure regulator. Following in both gas supply lines after the pressure regulators each gas supply line comprises a leak valve 63, 64. The leak valves 63, 64 ensure a constant gas flow of the respective noble gas from the gas bottle 61, 62 to the tube 40, and accordingly into the inner gas confining vessel 41. The leak valves 63, 64 preferably are configured in a way that all components getting into contact with the process gas, i.e. the gas the flow of which is to be controlled, are made of metals. In this way undesired contaminations of the process gases with contaminants can be avoided or at least reduced and the tube system including the leak valves 63, 64 can be baked-out.

In the direction of gas flow from the gas bottles 61, 62 to the tube 40 both gas supply lines are connected. Following in the direction of gas flow, in the combined gas supply line a purifier 65 and a gas valve 68 follow before the gas supply line is connected to tube 40 which terminates in the inner gas confining vessel 41. As described above with reference to FIGS. 3 and 5, the tube 40 comprises a first tube 40a which forms the terminating portion of tube 40 and is attached to base platform 31 and a second tube 40b which is connected to the outer vacuum wall 90. Both, the first and the second tube 40a, 40b are made of a metal to avoid undesirable contaminations of the gases led through the tubes. Nevertheless that both tubes 40a, 40b are made of metal they are configured in a different manner so that the first tube 40 has a considerably higher thermal conductivity than the second tube 40b. Because the first tube 40a is connected to the base platform 31 the first tube 40a, during operation of the ion source, is cooled to a cryogenic temperature. The first tube 40a is formed into a bellow shape. At least a portion of the surface of the first tube 40a is covered with a chemical getter material. The second tube 40 is made of a material of lower thermal conductivity and is designed with a thinner tube wall than the first tube 40a to keep the thermal conductivity of the second tube 40b low. Preferred materials having a high and a low thermal conductivity are described above.

The gas supply line comprises a bypass line 66 with a bypass valve 67 to directly connect the gas supply line with the vacuum chamber 10.

Furthermore a heater 73a is provided on the gas supply tube 40 with which the gas supply tube 40 can be heated.

When operating the gas field ion beam system for several days with high helium or neon gas flows, the operation of the gas field ion source can include a step of allowing the cryo-pumping surfaces, i.e. the base platform 31, the first tube 40a of the gas supply tube 40, the extractor electrode 38, the insulators 33, 37 and the emitter tip 34 to warm up briefly. As a result of this warming-up the accumulated cryo-adsorbed atoms can be desorbed and then pumped away via the turbo-molecular pumps 17, 60. Also the first tube 40a of the gas delivery tube 40 which supplies the noble gas like helium or neon gases from the external gas supply bottles 61, 62 to the proximity of the emitter tip 34 is cryogenically cooled. This serves to purify the supplied gases by allowing impurities, such as $H_2O$, $CO$, $CO_2$, $N_2$, $O_2$, etc., to be cryo-pumped onto the first tube's 40a inner surface. To clean the inner surface of the tube 40 of the gas supply, it can be periodically heated to a high temperature by heater 73 similar as the other cryo-pumping surfaces to a temperature of at least 100° C., more preferable to 150° C. or even 200° C., to allow these accumulated adsorbates to be released and pumped away via the turbo pumps 60, 17.

The gas delivery tube 40 has an inner diameter that is between 1 mm and 6 mm. The gas delivery tube 40 connects the external gas delivery system through the walls 90 of the external gas containment 81, all the way to the internal gas confining vessel 41. The gas delivery tube 40 has a bypass valve 67, to facilitate the exhausting of the desorbed gases. The bypass valve 67 prevents the desorbed gases from being largely trapped in the inner gas confining vessel 41. The bypass valve 67 can be completely external to the vacuum housing, or integrated into the inner gas confining vessel 41.

It has turned out that it is advantageous to periodically clean the emitter tip of adsorbed adatoms by one of three techniques. One of the three techniques is to periodically heat the emitter tip 34 while keeping the components forming the inner gas confining vessel 41 at cryogenic temperature, for example to a temperature of 300° C. or more for a time of 1 minute or more. This heating of the emitter tip 34 can cause the accumulated adsorbed atoms to be thermally excited so that they desorb and transfer to less critical surrounding surfaces. Those surfaces, primarily the surface of the extractor electrode 38 being cold, will hold the adatoms and reduce the likelihood of being transferred back to the emitter tip 34.

As described above, small amounts of spurious gas atoms that arrive at the emitter tip of the gas field ion source can cause the emitted beam to fluctuate up and down in intensity or diminish gradually and progressively. These effects can be diminished by a gas manifold (or gas supply system) that is designed for the purpose and operational procedures that optimize performance. The gas supply system includes a bypass valve that allows the gas supply lines to be evacuated as a cleaning process in preparation to their use with helium or neon gas. The gas supply hardware is prepared with materials and methods that are well established for UHV service. The gas supply system is equipped with integrated heaters that can heat the gas supply system to high temperatures such as 150° C., 200° C. or even 400° C. for long periods of time in the range of 8 hours, 12 hour, or even 16 hours to help to desorb any vacuum contaminants. During this heating time, a valve 68 in the line to the inner gas confining vessel 41 is closed, and a bypass valve 67 in a pipe 66 leading to the sample chamber 10 is opened. As a result, the evolved gases are pumped away to the sample chamber 10 where their impact is not significant. The baking process can be repeated after the gas supply system is vented to atmosphere (e.g. after a service activity such as a bottle replacement, or a valve replacement) or when the level of emission stability needs to be improved. A chemically active purifier 65 can also be incorporated as a part of the gas supply system to reduce common impurities. The purifier can be operated hot at 100° C., 200° C. or even 300° C. or at room temperature or any desired temperature by way of a dedicated heater for the purifier. The purifier's heater can be powered by DC power so that there is no interference from the 60 Hz or 50 Hz magnetic fields. The gas supply system also can comprise a pressure gauge 69, to monitor the pressure downstream of the precision leak valves, but before the gas is delivered to the inner gas confinement. Alternative embodiments for a gas purifier 65 are described herein below with reference to FIGS. 6-8.

The inner gas confining vessel of the gas field ion source has a built in valve, the "flapper valve" 42 that, when opened, connects the inner gas confining vessel 41 with the outer gas containment 81 and allows the pumping speed of the volume of the inner gas confining vessel to be increased from about 1 liter/sec (when the only opening is through the extractor hole 39) to 22 liter/sec when the additional valve is open. Use of this valve can help to achieve a low base pressure which can help with the stable neon emission. Use of this valve can also speed up the time required to purge one gas (e.g. helium) before switching to another gas (e.g. neon). The valve can be mounted directly to the inner gas confining vessel, or it can be located more remotely. The valve can also be incorporated into the gas delivery line 40.

The inner gas confining vessel can be both heated and cooled through a flexible thermal conductive element 32 (shown in FIG. 3). The terminal end of the flexible thermal conductive element is a heater 73c mounted to a cryogenic cooler. When the dewar is filled with a cryogen it serves to keep the gas field ion source cool. When the dewar is not filled with a cryogen, the heater can be powered to heat both the dewar and the components forming the inner gas confining vessel. This design is especially favorable since the dewar and the inner gas confining vessel are thermally intimate and it is not a simple matter to achieve a temperature difference between them. During the baking of both of these parts, the power required is about 25 watts, and the achieved temperature is 130° C. on the dewar, and 110° C. of the components forming the inner gas confining vessel 41.

The chemical getter in the first tube 40a of the gas supply systems works upon chemical gettering to pump chemically active species. The gettering effect is achieved by bonding of an active species to a reactive material which commonly is a combination of titanium or tantalum and that is freshly evaporated by the getter ion pump.

Figure 6:
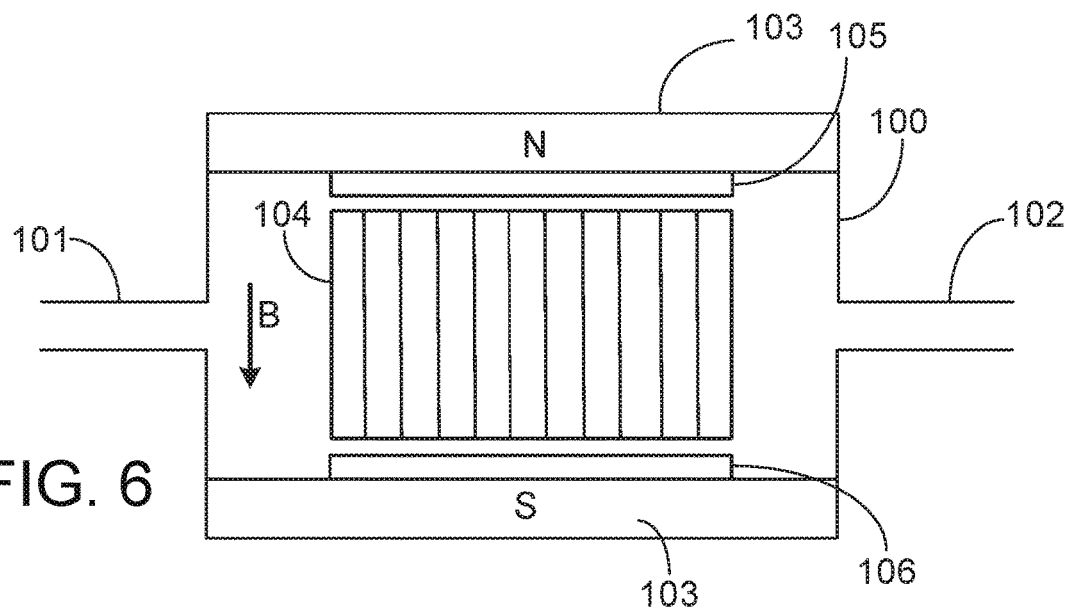
FIG. 6 shows a principle sketch of a first embodiment for a gas purification system.

FIG. 6 shows a first embodiment of gas purifier 65 based on selective ionization of gases. The gas purifier comprising a hollow housing 100 with a gas inlet 101 and a gas outlet 102. Within the housing a magnet 103 is arranged proving a magnetic field B in a direction perpendicular to the flow direction of the gas leading from in inlet 101 to the outlet 102. In addition two ground electrodes 105, 106 made of a chemical getter material, such as Titanium, are provided. Further within the hollow housing 100 several cellular electrodes 104 are provided. Each cellular electrode 104 is in a cylindrical form with its cylinder axes oriented parallel to the direction of the magnetic field.

Both ground electrodes 105, 106 may be electrically grounded. To the cellular electrodes 104 a positive high voltage of several kV electrical potential relative to the ground electrodes 105, 106 is applied. During operation electrons are generated by electrical discharge between the cellular electrodes and the ground electrodes 105,106. Due to the magnetic field these electrons are trapped within the anode cells. If gas is led through the hollow volume of the purifier positive ions are generated by molecule-electron collisions within the anode cells. Due to the electrical potential difference between the cellular electrodes 104 and ground electrodes 105,106 the positive ions are accelerated into the direction of the ground electrodes. The ground electrodes 105, 106 serve concurrently as a chemical getter. The positive ions hitting the ground electrodes plates 105, 106 are trapped by the chemical getter, e.g. Titanium.

Because noble gases such as helium and neon have a considerably lower ionization probability than most undesirable chemical gas species such as $O_2$, $H_2O$, CO, $CH_4$ and $N_2$ mainly these reactive chemical species are trapped and buried by the chemical getter of the ground electrodes while the noble gases can pass the purifier to the most extent unaffected which leads to a considerable purification of the gases and elimination of undesired reactive gas species.

The electrical potential of the cellular electrode 104 can be adjusted to optimize the selectivity of the ionization.

Figure 7:
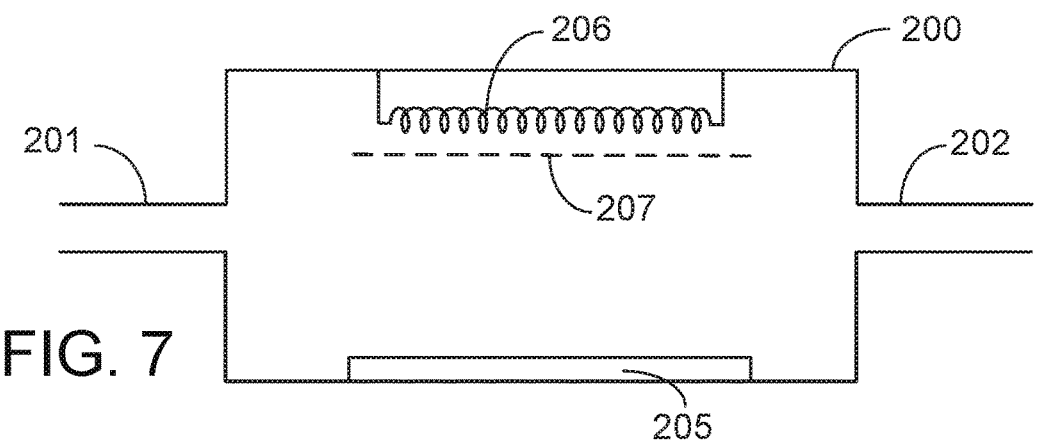
FIG. 7 shows a principle sketch of a second embodiment for a gas purification system.

FIG. 7 shows a second embodiment of a gas purifier 65 based on selective ionization of gases. The gas purifier again comprises a hollow housing 200 with a gas inlet 201 and a gas outlet 202. In addition a heated filament 206, an acceleration grid electrode 207 and a ground electrode 205 are provided within the hollow housing 200. The filament 206 and the ground electrode 205 can be kept at ground potential while the accelerating electrode 207 is supplied with a positive electrical potential of several 100 Volts relative to the filament 206 and the ground electrode 205. The ground electrode 205 is made of a chemical getter material, such as Titanium.

Due to its heating thermionic electrons are emitted by filament 206. These thermionic electrons are accelerated by the voltage difference of the acceleration electrode 207 into the direction of the acceleration electrode 207. Such electrons passing the acceleration electrode afterwards are decelerated. Gas molecules moving through the hollow volume collide in the space between the acceleration electrode 207 and the ground electrode 205 with the electrons and are in-part positively ionized. The positively charged ions are accelerated into the direction of the ground electrode 205 and trapped there by the chemical getter material of the ground electrode.

Like in the embodiment described with reference to FIG. 6, because noble gas atoms such as helium and neon atoms have a considerably lower ionization probability than most undesirable chemical gas species such as $O_2$, $H_2O$, CO, $CH_4$ and $N_2$, mainly these reactive chemical species are trapped by the chemical getter of the ground electrode 205 while the noble gases can pass the purifier to the most extent unaffected which leads to a considerable purification of the gases and elimination of undesired reactive gas species.

The electrical potential of the acceleration electrode 207 can be adjusted and tuned to optimize the selectivity of the ionization.

Figure 8:
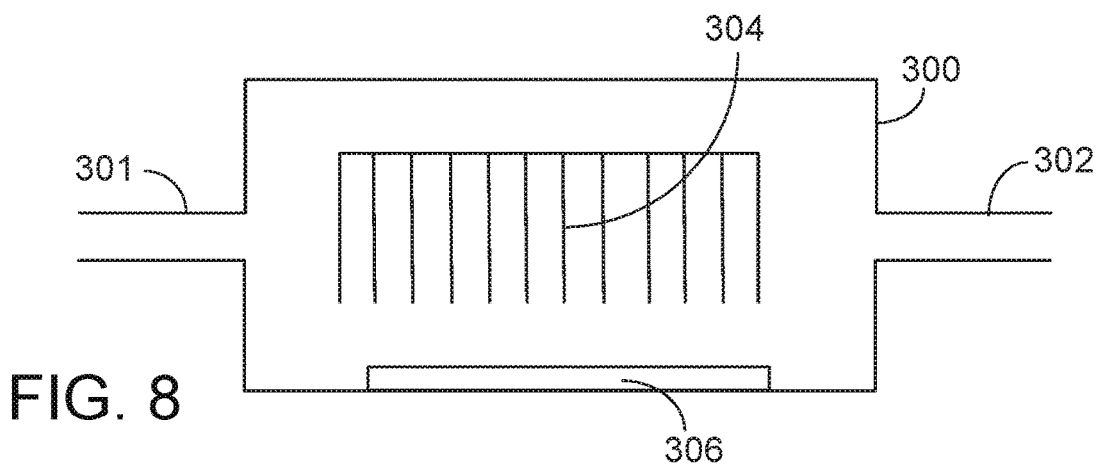
FIG. 8 shows a principle sketch of a third embodiment for a gas purification system.

FIG. 8 shows a third embodiment of gas purifier 65 based on selective ionization of gases. The gas purifier again comprises a hollow housing 300 with a gas inlet 301 and a gas outlet 302. In addition an array of extremely sharp emitters 304 is placed in line with the gas path from the inlet 301 to the outlet 302. In addition a ground electrode 306 is provided within the hollow housing 300. The ground electrode 306 is made of a chemical getter material, such as Titanium.

The emitters 304 are biased with a high positive electrical potential of 10 kV or more relative to the ground electrode 306. As the gas molecules or atoms pass through the array of emitters 304, in the neighborhood of the tips of the emitters where the electrical field strength is enhanced, gas atoms and gas molecules can become ionized due to electrical field ionization. Positively charged ions then are accelerated into the direction of the ground electrode 306 and trapped there by the chemical getter material of the ground electrode. The likelihood of a particular gas species to become ionized in the neighborhood of the tip apex of the emitters 304 strongly depends on the gas species itself and on the electrical field strength in the neighborhood of the tip apexes. Since the likelihood of becoming ionized is smaller for noble gases than for any other gases by proper tuning the voltage between the emitters 304 and the ground electrode 306 the selectivity of ionization can be tuned.

In the embodiments described with reference to FIGS. 6 to 8 the selective ionization is achieved either with a flood of electrons or by a high electrical field causing field ionization. In a further alternative embodiment the selective ionization can be achieved by a flood of photons by providing a light beam with high intensity in a region between two electrodes biased with some electrical potential to suck away ions generated by photo-ionization. Again, the electrode having a negative electrical potential includes a chemical getter to trap ions impinging on it. In a similar further alternative embodiment a flood of ions can be used to cause selective ionization due to ion-molecule collisions.

Because of the strong difference in the likelihood of getting ionized between noble gases and non-noble gases 90% or more of undesired or non-noble gas ions can become removed from the gas stream with only removing 10% or less of the noble gases from the gas stream.

The bottles 61, 62 of noble gases (He, Ne, Ar) can provide the noble gas at a typical pressure in the range of 25 bar to 150 bar. The noble gases typically have impurities at proportions in the range between 1 ppm and 10 ppm.

In the gas supply line following the regulator the pressure of the noble gases are typically 0.1 to 3 bar.

The pressure of the noble gases in the gas supply line downstream of the leak valves 63, 64 typically is in the range 0.025 mbar to 30 mbar.

When in use, the noble gas flow out of the gas supply system into the inner gas confining vessel 41 typically is in the range $3 \times 10^{-5}$ mbar liter/sec to $4 \times 10^{-3}$ mbar liter/sec.

The gas conductance of the gas supply tube 40 typically is in the range between 0.005 liter/sec and 0.05 liter/sec.

The temperature of the ion source and the cryogenically cooled part of the gas supply tube, when operated in an ion emitting mode, typically is in the range 50 to 78 Kelvins. When baked out for eliminating contaminants the temperature of the components forming the inner gas confining vessel as well as the components arranged therein typically is in the range 100° C. to 200° C.

As described above, the gas supply tube 40 can include an integrated getter to provide getter pumping of impurities within the noble gases.

The gas supply system can have an all metal leak valve to avoid to introduce additional impurities. In this manner the gas supply system can become pre-cleaned so that it has a total outgassing rate from the walls resulting in a pressure rise that is less than $10^{-8}$ mbar/sec without vacuum pumping. The gas supply system then can have a reduced outgassing characteristics so that the total outgassing rate produces a pressure rise of less than $1 \times 10^{-4}$ mbar/hour.

In an embodiment the gas supply system can have a reduced outgassing characteristics so that the total outgassing rate per area corresponds to $q=2 \times 10^{-11}$ mbar liter/sec/cm$^2$.

In another embodiment the gas supply system is configured for baking at a temperature of 200° C. for a time period of at least 6 hours.

In still another embodiment the gas supply system's pressure regulators include capacitance pressure gauges to facilitate and improve cleaning of the internal surfaces thereof. Pressure regulators comprising dial gauges comprising bourdon tubes are avoided.

In still another embodiment the gas supply system does not comprise any pressure regulator at all and the high pressure from the gas bottles is directly applied to the controlled leak valves.

In a cleaning method the inner surfaces of the components of the gas supply system are baked at a temperature between 100° C. and 200° C. in the presence of oxygen at a pressure in the range 0.3 mbar to 3 mbar. By such baking in the presence of oxygen any hydrocarbons are volatilized and the steel becomes conditioned. To the extent necessary to achieve the desired low outgassing properties the gas supply system can be baked at a temperature between 100° C. and 200° C. by alternatingly supplying oxygen and evacuating in a repeated fashion. In this way the gas supply system can become vacuum purged to release any accumulated outgassing materials.

What is claimed is:

1. An ion source, comprising:
   an external housing;
   an internal housing arranged within the external housing;
   an electrically conductive tip within the internal housing;
   a gas supply system comprising a first tube having a hollow interior and a second tube having a hollow interior; and
   a cooling system configured to cool the electrically conductive tip,
   wherein:
   the gas supply system is configured to supply a gas through the first and second tubes and then into a neighborhood of the electrically conductive tip;
   the first tube is attached to the second tube;
   the second tube is connected to the external housing;
   the first tube has a terminating portion terminating in or at the inner housing;
   the first tube is connected to the cooling system;
   the first tube comprises a material with a high thermal conductivity; and
   the second tube comprises a material of low thermal conductivity;
   a chemical getter material is provided in the hollow interior of the first tube.

2. The ion source of claim 1, wherein the chemical getter comprises at least one material selected from the group consisting of titanium, iron, barium, aluminum, palladium, zirconium, vanadium, and alloys thereof.

3. The ion source of claim 1, wherein the first tube has a bellow shape.

4. The ion source of claim 1, further comprising a heater within the external housing.

5. The ion source of claim 1, wherein the cooling system is connected to a base portion of the inner housing.

6. The ion source of claim 1, further comprising a gas purification system.

7. The ion source of claim 6, wherein the gas purification system is configured to purify the gas by ionization of contaminants.

8. The ion source of claim 7, wherein the gas purification system comprises an electrode and a voltage supply providing an electrical potential to the electrode.

9. An ion beam system, comprising:
   an ion source according to claim 1;
   an objective lens; and
   a deflection system,
   wherein the objective lens and deflection system are configured to focus the ion beam onto a sample and scan the sample with a focused ion beam.

10. A method of operating an ion beam system comprising an ion source, an objective lens and a deflection system, the method comprising:
    using the ion source to provide an ion beam; and
    using the objective lens and deflection system to focus the ion beam onto a sample and scan the sample,
    wherein the ion source comprises an ion source according to claim 1.

* * * * *